United States Patent [19]

Niemi

[11] Patent Number: 4,924,343

[45] Date of Patent: May 8, 1990

[54] SOLID STATE OPTICAL RELAY

[75] Inventor: Bill H. Niemi, San Diego, Calif.

[73] Assignee: Sermed Incorporated, San Diego, Calif.

[21] Appl. No.: 339,319

[22] Filed: Apr. 17, 1989

[51] Int. Cl.$^5$ ............................................. H02H 3/08
[52] U.S. Cl. ........................................ 361/98; 561/90; 561/93; 561/101; 523/277; 523/284; 523/300
[58] Field of Search ............... 261/87, 93, 98, 101; 330/207 P, 298; 357/23.13; 307/296.4, 296.5, 265; 323/300, 265, 274, 275, 276, 277, 222, 224, 289; 361/90, 91, 92, 86

[56] References Cited

U.S. PATENT DOCUMENTS 4,581,540 4/1986 Guajardo .................. 361/98 X
4,825,330 4/1989 Walchle ..................... 361/101 X

*Primary Examiner*—Derek S. Jennings
*Attorney, Agent, or Firm*—Hill, Van Santen, Steadman & Simpson

[57] ABSTRACT

A solid-state, four terminal optical relay has a current regulator with two input pins, and an output switch with two output pins. The relay includes an optical isolator assembly so that the current which causes switching of the relay is optically, rather than electrically, transmitted to an output switch driver. The relay includes an internal current overload detect and latch circuit which operates if the relay is switched on into a shorted load, or if a short is switched in across the load while the relay is on. The current overload detect and latch circuit is sufficiently fast to permit the relay to be continuously pulsed into a shorted load without damage to the relay.

26 Claims, 2 Drawing Sheets

SOLID STATE OPTICAL RELAY

BACKGROUND OF THE INVENTION

1. Field of the Invention

The present invention related to a solid state relay with an optical isolator assembly and specifically to such a relay with circuitry for detecting overload conditions to protect the relay in the event the relay is switched on into a shorted load, or if a short is switched across the load while the relay is on.

2. Description of the Prior Art

Optical isolators are known in the art for use either as a discrete component, connected in a circuit with other components, or integrated in a chip with other components as a unit. Such isolators are used, for example, in combination with Darlington drive circuits, triac driver circuits, Schmitt trigger circuits, and various types of logic gate circuits.

Solid state relays, with and without an optical isolator, are also known in the art. A problem in the use of such relays is their susceptibility to damage under overload conditions, such as if the relay is switched on into a shorted load, or if a short is switched across the load while the relay is on.

SUMMARY OF THE INVENTION

It is an object of the present invention to provide a solid state relay having an optical isolator which is protected against damage under overload conditions.

In accordance with the principles of the present invention, the above object is achieved in a solid state relay having an optical isolator assembly, and an overcurrent detect and latch circuit which operates in the presence of a shorted load to permit the relay to be continuously pulsed, without damage to the relay.

The relay disclosed herein is a four terminal device having two input or control pins, and two output pins. The input pins are TTL level compatible, with the input representing 10 standard TTL unit loads. The output pins are connected to a power MOSFET switch, which has a zero offset voltage at the output, and a low resistance when in the conducting state. The relay input and the relay output are totally electrically isolated by optical coupling.

The general operation of the relay is similar to that of an electro-mechanical relay, however, the relay disclosed herein has much higher reliability, and a much longer life. The relay also switches much faster than most conventional electro-mechanical relays, and does not exhibit the so-called "switch bounce" normally associated with mechanical switches.

The relay, as noted above, includes built-in protection against short circuit damage. The relay can be pulsed on and off into a short circuit, or the load circuit can be shorted while the relay is on, without damage to the relay. An input voltage of greater than 3.8 volts causes the relay to switch on, while a voltage of less than 1.8 volts insures that the relay will be off.

The input terminals are connected to a current regulator, which regulates the current to a series of light emitting diodes, regardless of variations in the input drive voltage. The input drive voltage may vary over the range of 6.0 to 3.8 volts, with a minimal change in the light emitting diode current and the input current. The current regulator also maintains constant current inspite of changes in the housing temperature.

The light emitting diodes which receive current from the current regulator are part of an optical isolator assembly. Preferably two light emitting diodes which emit infrared light are provided. The light from the light emitting diodes is received by a photovoltaic diode array, which is also a part of the optical isolator assembly.

The photovoltaic array includes a plurality, such as up to 40, photovoltaic diodes which generate voltage in response to the incoming light from the light emitting diodes. The photovoltaic array generates both positive and negative output voltages. The array can be tapped asymmetrically, so that the positive output is higher in amplitude than the negative output.

An output switch driver receives the output voltage from the optical isolator assembly, and uses mainly the positive output therefrom to drive an output switch. The switch driver is capable of providing active OFF drive to the output switch whenever the output from the photovoltaic array drops to zero, or when turned OFF by the overcurrent detect and latch circuit in response to an overload condition.

The overcurrent detector sets a latching circuit whenever the sensed current in the output circuit exceeds a predetermined threshold. Once the latch is set, it remains latched until the input drive signal is removed. Once the latch is set, the output switch is driven OFF.

The output switch is capable of switching up to 1.0 amperes d.c. current with no offset voltage. The maximum output current is limited by thermal restrictions of the mechanical layout. The circuit design itself, without the mechanical considerations, permits a much higher output current, such as at least 5 amperes. The current sensing circuitry provides a voltage in proportion to the load current to the overcurrent latch.

DESCRIPTION OF THE PREFERRED EMBODIMENTS

Figure 1:
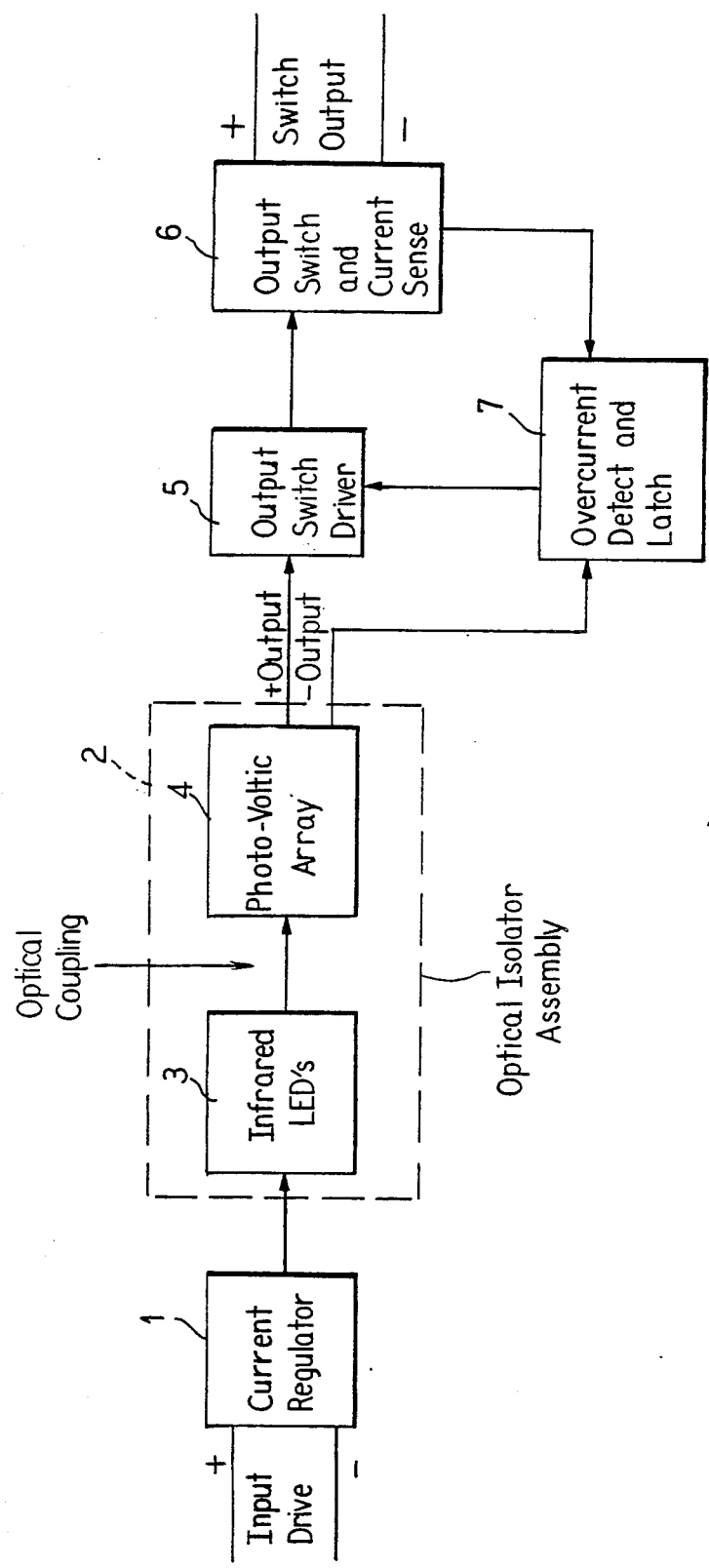
FIG. 1 is a schematic block diagram of a solid state relay constructed in accordance with the principles of the present invention.

As shown in FIG. 1, an input drive voltage is supplied to a current regulator 1, which maintains a relatively constant current supply to a plurality of infrared light emitting diodes 3. The light emitting diodes are part of an optical isolator assembly 2, and emit light which is optically coupled to a photovoltaic array 4, also a part of the optical isolator assembly 2. The photovoltaic array 4 produces a positive output and a negative output. The positive output is supplied to an output switch driver 5, which controls an output switch and current sensed circuit 6. The current sensing portion of the output switch and current sensed circuit switch senses the presence of a short circuit in the load to which the relay is connected, and provides a signal identifying overload conditions to an overcurrent detect and latch circuit 7. The negative output of the optical isolator assembly 2 is also supplied to the overcurrent detect and latch circuit 7. Under overload (i.e., short circuit) conditions, the overcurrent detect and latch circuit 7 becomes latched whenever the sensed current in the circuit 6 exceeds a predetermined threshold. Once set, the circuit 7 remains latched until the input drive signal is removed, and drives the output switch to an OFF state.

Figure 2:
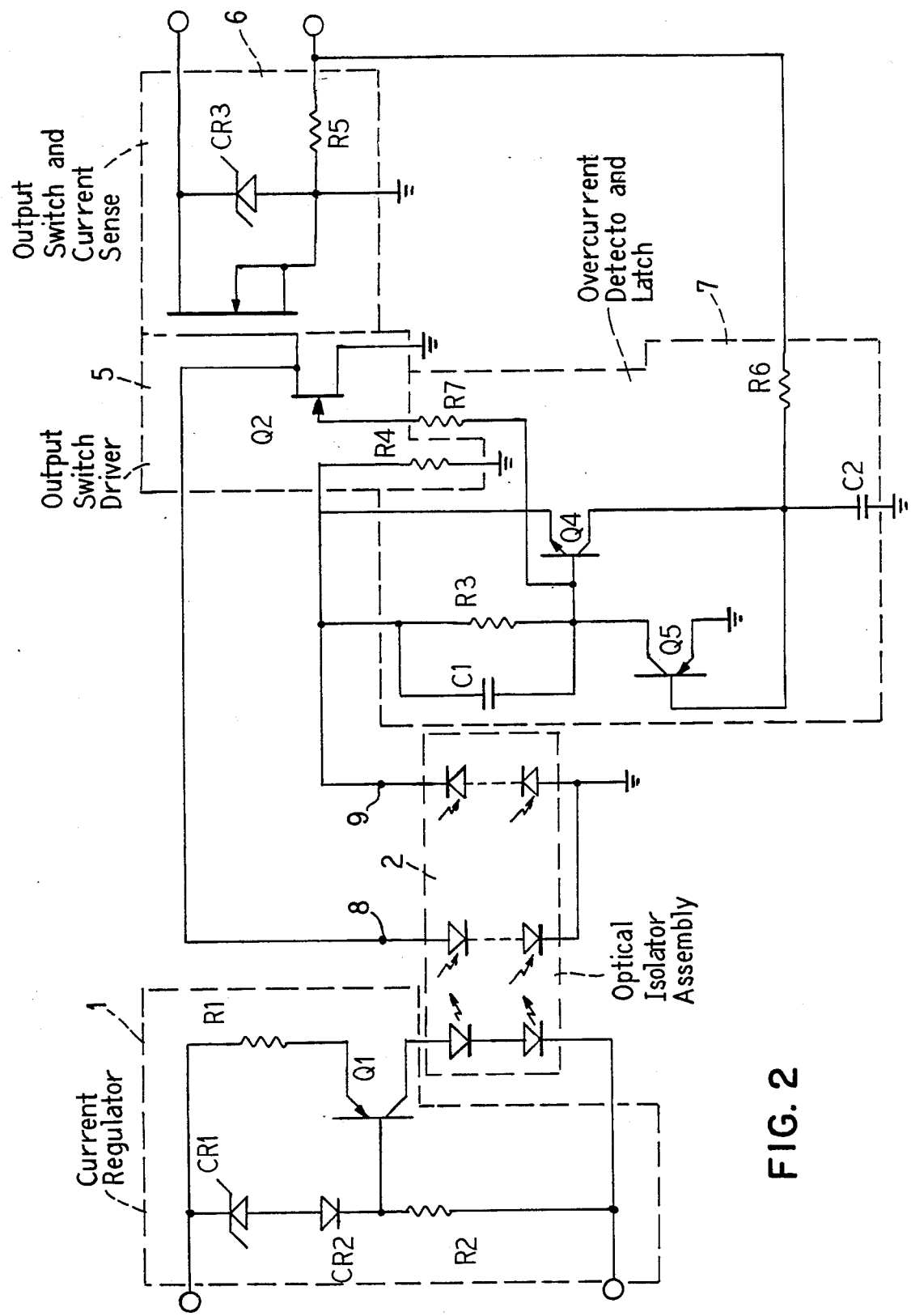
FIG. 2 is a detailed circuit diagram of the solid state relay shown in FIG. 1.

Further details of the operation of the relay are described below in connection with the circuit diagram of FIG. 2.

As shown in FIG. 1, the current regulator is a conventional current source having a PNP transistor Q1. The current regulator 1 also includes a Zener diode CR1, a conventional diode CR2, and resistors R1 and R2. The Zener diode CR1 establishes a reference voltage of, for example, 1.2 volts. CR1 is a special integrated circuit which acts as a Zener diode, only with a much lower temperature coefficient. CR1 has a low temperature coefficient and a stable voltage drop, despite changes in current through the diode CR1. The diode CR2 establishes a voltage drop to offset the base-emitter drop of the transistor Q1. Because the temperature coefficient of the forward voltage of the diode CR2 will be close to the temperature coefficient of the base-emitter voltage of the transistor Q1, the effects of the drift in the base-emitter voltage of the transistor Q1 will be minimized. The resistor R2 establishes a forward current bias for the diodes CR1 and CR2, as well as a base current for the transistor Q1. The voltage drop across the resistor R1 will closely follow the voltage drop across the Zener diode CR1, so that the emitter current of the transistor Q1 is approximately the voltage drop across the Zener diode CR1 divided by the resistance of the resistor R1. The resistance of the resistor R1 and the voltage drop across the Zener diode CR1 thus determine the emitter current. If the current gain of the transistor Q1 is sufficiently high, the collector current of the transistor Q1 (and thus the current through the light emitting diodes) will be very close to the emitter current. In the actual circuit, the drop across the resistor R1 is approximately 1.1 volts, because the base-emitter voltage of the transistor Q1 is about 0.1 volts higher than the voltage drop across CR2. The light emitting diode current is approximately 1.1 volts/82 ohms=13.4ma nominal.

The optical isolator 2 has more output diodes than conventional photovoltaic type optical isolators. The optical isolator 2 used in the relay disclosed herein consists of two light emitting diodes in series which receive current from the current regulator circuit 1. The output of the optical isolator assembly 2 consists of two banks of photovoltaic diodes, each bank consisting of a plurality of photovoltaic diodes connected in series. The diode banks are respectively polarized to provide positive and negative output voltages. There are more diodes in the bank which produces the positive voltage output than in the bank which produces the negative voltage output. For example, the diode bank between ground and point 8 may consist of 30 photovoltaic diodes, which provide a nominal +12.0 volts output voltage (at 25° C.). The diode bank from ground to point 9 may, for example, consist of 10 diodes, which provide a nominal −4.0 volts output voltage. The voltage output of the optical isolator assembly 2 has a high negative temperature coefficient, so that the output voltage at 100° C. is approximately half of the output voltage at 25° C. The number of diodes in the output banks must be sufficiently high to permit adequate operating output voltages at the highest operating temperature desired, especially for the output transistor gate drive. The exemplary embodiment shown in FIG. 2 is designed to operate up to a housing temperature of 100° C.

As an alternative to the asymmetrical higher output optical isolator assembly described above, the transistor Q3 in the output switch and current sense circuit 6, described in greater detail below, may be selected to have a lower gate threshold, which would permit the use of a lower output, symmetrically tapped optical isolator assembly.

The output switch driver circuit 5 includes a field effect transistor Q2, which may be a depletion mode n-channel junction field effect transistor, such as is commerically available under the designation 2N4393, or its equivalent. Provided the overcurrent detect and latch circuit 7 is not latched, a negative voltage will be supplied to the gate of the transistor Q2, which is above the worst case pinch off voltage of the transistor Q2. The transistor Q2 will then be pinched off, i.e., its drain to source resistance is high and the drain to source current will be very low. The positive voltage output, such as +12.0 volts, from the optical isolator assembly 1 will therefore appear at the gate of the transistor Q3 in the output switch and current sense circuit 6, this will cause the transistor Q3 to become conducting i.e., to be driven ON, so that the relay is therefore ON.

When the voltage difference across the two input pins are reduced below the worst case off threshold, the output of the optical isolator assembly will drop to zero. A resistor R4 in the output switch driver circuit 5 discharges any circuit capacitance to zero, which results in the gate of the transistor Q2 going to zero volts. The transistor Q2 will then be ON, resulting in a low drain to source resistance for the transistor Q2. The gate capacitance of the transistor Q3 will then be discharged through the transistor Q2, and the gate of the transistor Q3 will be pulled to zero volts.

The transistor Q2 is preferably selected to have a pinch off voltage of less than 2.0 volts to ensure operation at a housing temperature of 100°C., when the output of the optical isolator assembly 2 is at its lowest voltage. At least one advantage of the aforementioned drive arrangement is that it provides a low impedance OFF drive to the transistor Q3, even after input power is removed. The transistor Q3 is thus guaranteed to be OFF when the input signal is OFF, and is not easily tripped ON due to pulses or a high voltage change with respect to time occurring at the output terminals. Because of the low drain to source resistance of the transistor Q2 in the ON state, the transistor Q3 is rapidly driven to the OFF state, whether by removal of the input drive, or by overcurrent latch control, as described below.

The output switch, i.e., the transistor Q3, is a power MOSFET, such as type IRF 130, available from several commercial sources. Alternatively, the transistor Q3 may be a low gate threshold transistor such as the RCA RFM 12N10 (PCF 12N10L).

The output switch and current sense circuit 6 also includes a Zener diode CR3 which functions as a transient suppressor, and may be type P6KE91A. The diode CR3 clamps the drain to source voltage of the transistor Q3 from becoming higher than approximately 91 volts. The diode CR3 thus functions to prevent the drain to source breakdown voltage of the transistor Q3 from being exceeded for inductive load switching or other line noise transients. A resistor R5 senses the output load current across the output terminals, and generates a negative voltage with respect to ground in proportion to the output current (the generated voltage being the product of the load current and the resistance of a resistor R5). The resistance value of the resistor R5 can be adjusted for the desired current sensing threshold.

The voltage across the resistor R5 is supplied to the overcurrent detect and latch circuit 7 via a low pass filter formed by a resistor R6 and a capacitor C2. The low pass filter prevents noise pulses from setting the overcurrent latch, and also assists in clearing the latch during the initial turn ON of the relay. When the voltage across the resistor R5 exceeds the base-emitter cut in voltage of a transistor Q5 (approximately 0.45 volts at 25° C.), the transistor Q5 becomes conducting, thereby forcing the collector of the transistor Q5 to ground. A further transistor Q4 is then placed in a conducting state, generating a negative drive voltage, which is supplied to the base of the transistor Q5. The latch consisting of the transistors Q5 and Q4 is thus set, and the emitter of the transistor Q4 is pulled to approximately −0.5 volts. It is possible to pull down the −4.0 volts open-circuit output of the optical isolator assembly 2 to −0.5 volts because the optical isolator assembly 2 has a relatively high output impedance (on the order of 100K ohms).

Once the latch is set, the collector of the transistor Q5 is very close to zero volts, bringing the gate of the transistor Q2 to ground. The transistor Q2 thus becomes conducting, and disables the output switch Q3. A resistor R7 is provided to prevent the effects of gate capacitance of the transistor Q2 from inadvertently setting the latch. The resistor R7 in combination with the circuit capacitance form another low pass filter. A resistor R3 and a capacitor C1, also in the overcurrent detect and latch circuit 7, clear the latch when the output from the optical isolator assembly 2 first appears. The capacitor C1 and the resistor R3, in combination with the internal resistance of the optical isolator output, also form another low pass filter to further prevent inadvertent setting of the latch under external noise conditions.

The transistors Q4 and Q5 must have a high gain at low collector currents. The transistor Q4 is preferably a commercially available type 2N930 transistor or its equivalent, and the transistor Q5 is preferably a commercially available type 2N3964 transistor or its equivalent. Both of these commercially available transistors have guaranteed gains at very low currents, such as 10 microampers.

Although modifications and changes may be suggested by those skilled in the art it is the intention of the inventor to embody within the patent warranted hereon all changes and modifications as reasonably and properly come within the scope of his contribution to the art.

I claim as my invention:

1. A relay for use connected between an input drive voltage and a load, said relay comprising:
    a solid-state output switch connected across said load having a conducting state and a nonconducting state;
    means for generating an optical signal corresponding to said input drive voltage;
    two photodiode banks disposed to receive said optical signal and respectively polarized for generating a positive voltage corresponding to said input drive voltage at a positive voltage output and a negative voltage corresponding to said input drive voltage at a negative voltage output;
    solid-state means connected to said positive voltage output for driving said output switch to cause said output switch to change state in dependence upon said input drive voltage exceeding or falling below at least one selected level; and
    solid-state overload protection means connected to said negative voltage output, to said means for driving and to said load for causing said means for driving to drive said output switch to said non-conducting state upon the occurrence of a shorted load.

2. A relay as claimed in claim 1, further comprising current regulator means connected across said input drive voltage for generating a first substantially constant voltage when said input drive voltage exceeds said at least one selected level, and for generating a second substantially constant voltage when said input drive voltage falls below said at least one selected level.

3. A relay as claimed in claim 1, further comprising solid-state means connected to said load for sensing the occurrence of a shorted load and supplying a signal identifying the occurrence of a shorted load to said overload protection means.

4. A relay as claimed in claim 1, wherein said overload protection means is a means for latching which becomes set at a selected voltage level upon the occurrence of a shorted load and remains set until removal of said input drive voltage.

5. A relay as claimed in claim 1, wherein said means for driving is a drive switch having a control electrode connected to said overload protection means, and a path controlled by said control electrode connected across said voltage corresponding to said input drive voltage.

6. A relay as claimed in claim 5, wherein said overload protection means includes means for supplying an overload signal to said control electrode of said drive switch upon the occurrence of a shorted load, and wherein said drive switch is a type wherein said controlled path is normally conducting in the absence of said overload signal.

7. A relay as claimed in claim 6, wherein said means for supplying an overload signal in said overload protection means comprises:
    a first normally non-conducting switch connected to said load and responsive to become conducting upon the occurrence of a shorted load; and
    a second normally non-conducting switch connected to said first switch and to said control electrode of said drive switch, said second switch responsive to become conducting upon said first switch becoming conducting and thereby supplying said overload signal to said control electrode of said drive switch.

8. A relay as claimed in claim 7, wherein said overload protection means further comprises a filter connected between said load and said first switch.

9. A relay as claimed in claim 7, further comprising means for generating a further voltage corresponding to said input drive voltage which is supplied to said second switch, and wherein said overload protection means further comprises a filter connected between said means for generating a further voltage and said second switch.

10. A relay as claimed in claim 5, wherein said drive switch is a field effect transistor having a gate electrode which is said control electrode and a source to drain path which is said controlled path.

11. A relay as claimed in claim 10, wherein said field effect transistor is a depletion mode n-channel junction field effect transistor.

12. A relay as claimed in claim 1, wherein said output switch has a control electrode connected to said means for driving and a controlled path connected across said load.

13. A relay as claimed in claim 12, wherein said output switch is a field effect transistor.

14. A relay for use connected between an input drive voltage and a load, said relay comprising:
a bank of light emitting diodes connected across said input drive voltage;
a first bank of photovoltaic diodes disposed for receiving light from said light emitting diodes for generating a first voltage dependent on said input voltage;
a second bank of photovoltaic diodes disposed for receiving light from said light emitting diodes for generating a second voltage, different from said first voltage, dependent on said input voltage;
a solid-state output switch connected across said load having a conducting state and a non-conducting state;
solid-state means to which said first voltage is supplied for driving said output switch to said conducting state when said first voltage exceeds a selected level and for driving said output switch to said non-conducting state when said first voltage falls below said selected level; and
solid-state overload protection means connected to said means for driving and to said load, and to which said second voltage is supplied, for causing said means for driving to drive said output switch to said non-conducting state upon the occurrence of a shorted load.

15. A relay as claimed in claim 14, wherein said first bank of diodes is polarized such that said first voltage is a positive voltage and wherein said second bank of diodes is polarized such that said second voltage is a negative voltage.

16. A relay as claimed in claim 14, wherein said first bank of diodes consists of a first plurality of diodes and wherein said second bank of diodes consists of a second plurality of diodes, said first plurality of diodes being greater than said second plurality of diodes so that the magnitude of said first voltage is greater than the magnitude of said second voltage.

17. A relay as claimed in claim 14, wherein said first bank of diodes consists of a first plurality of diodes polarized for generating a positive voltage and wherein said second bank of diodes consists of a second plurality of diodes polarized for generating a negative voltage, and wherein said first plurality is greater than said second plurality so that the magnitude of said first voltage is greater than the magnitude of said second voltage.

18. A relay as claimed in claim 14, wherein said means for driving is a drive switch having a control electrode connected to said overload protection means and a path controlled by said control electrode connected across said first voltage.

19. A relay as claimed in claim 18, wherein said overload protection means includes means for supplying an overload signal to said control electrode of said drive switch upon the occurrence of a shorted load, and wherein said drive switch is a type wherein said controlled path is normally conducting in the absence of said overload signal.

20. A relay as claimed in claim 18, wherein said means for supplying an overload signal in said overload protection means comprises:

a first normally non-conducting switch having a control electrode connected to said load and a controlled path connected across said second voltage, said first switch responsive to become conducting upon the occurrence of a shorted load; and
a second normally non-conducting switch having a control electrode connected to the controlled path of said first switch and a controlled path connected across said second voltage, said second switch also connected to said control electrode of said drive switch, said second switch responsive to become conducting upon said first switch becoming conducting to supply said overload signal to said control electrode of said drive switch.

21. A relay as claimed in claim 20, wherein said overload protection means further comprises a filter connected between said load and said control electrode of said first switch.

22. A relay as claimed in claim 20, wherein said control electrode of said drive switch is connected at a junction between said first and second switches, and further comprising a filter connected between said junction and said second bank of photovoltaic diodes.

23. A relay as claimed in claim 14, further comprising current regulator means connected between said input drive voltage and said bank of light emitting diodes for generating a first substantially constant voltage to drive said light emitting diodes when said input drive voltage is above said selected level and for generating a second substantially constant voltage to drive said light emitting diodes when said input drive voltage falls below said selected level.

24. A relay for use connected between an input drive voltage and a load, said relay comprising:
a bank of light emitting diodes connected across said input drive voltage for generating light corresponding to said input drive voltage;
a first bank of photovoltaic diodes disposed for receiving light from said light emitting diodes and polarized for generating a positive voltage in response to said light;
a second bank of photovoltaic diodes disposed for receiving light from said light emitting diodes and polarized for generating a negative voltage in response to said light;
a drive switch having a controlled path connected across said positive voltage from said first bank of diodes and a control electrode to which said negative voltage from said second bank of diodes is supplied, said drive switch having a conducting state and a non-conducting state and assuming said conducting state when said negative voltage is at or more negative than a selected level;
an output switch having a control electrode connected to said controlled path of said drive switch and a controlled path connected across said load, said output switch having a non-conducting state and a conducting state and assuming said conducting state as long as said drive switch is in said conducting state;
a first overload protection switch having a control electrode connected to said load and a controlled path connected across said negative voltage from said second bank of diodes, said first overload protection switch being normally non-conducting and becoming conducting in response to the occurrence of a shorted load; and a second overload protection switch having a control electrode connected to the controlled path of said first switch at a junction and having a controlled path connected across said negative voltage from said second diode bank, said control electrode of said drive switch also being connected to said junction, said second overload protection switch being normally non-conducting and becoming conducting in response to said first overload protection switch becoming conducting such that said voltage at said control electrode of said drive switch becomes less negative than said selected level thereby causing said drive switch and said output switch to become non-conducting.

25. A relay as claimed in claim 24, further comprising a filter connected between said control electrode of said first overload protection switch and said load.

26. A relay as claimed in claim 24, further comprising a filter connected between said junction and said second diode bank.

* * * * *